United States Patent [19]
Kohno

[11] Patent Number: 5,148,398
[45] Date of Patent: Sep. 15, 1992

[54] SEMICONDUCTOR MEMORY DEVICE WITH BUILT-IN TEST CIRCUIT AND METHOD FOR TESTING THE SAME

[75] Inventor: Tohru Kohno, Chiba, Japan

[73] Assignee: Fujitsu Limited, Kawasaki, Japan

[21] Appl. No.: 553,027

[22] Filed: Jul. 3, 1990

[30] Foreign Application Priority Data

Jul. 4, 1989 [JP] Japan ................... 1-171283

[51] Int. Cl.$^5$ ............................................. G11C 13/00
[52] U.S. Cl. .................................... 365/201; 371/21.1
[58] Field of Search ............. 365/201; 371/21.1, 21.2, 371/22.5

[56] References Cited

U.S. PATENT DOCUMENTS 4,464,750  8/1984  Tatematsu .
4,899,313  2/1990  Kumanoya et al. .
4,916,700  4/1990  Ito et al. .

FOREIGN PATENT DOCUMENTS 206486  12/1986  European Pat. Off. .

OTHER PUBLICATIONS

IBM Technical Disclosure Bulletin, vol. 30, No. 11, Apr. 1988, N.Y., "Repair Calculation For Randon-Access Memory Redundance Using Built-in Logic and Scannable Latches", pp. 424-425.

IEEE Journal of Solid-State Circuits, vol. 24, No. 1, Feb. 1989, N.Y., "A redundancy Test-Time Reduction Technique in 1-Mbits DRAM With a Multibit Test Mode", Y, Nishimura et al., pp. 43-49.

*Primary Examiner*—Terrell W. Fears
*Attorney, Agent, or Firm*—Nikaido, Marmelstein, Murray & Oram

[57] ABSTRACT

A semiconductor memory device having a test mode function and a plurality of memory blocks each having memory cells arranged in a matrix and a method for testing the device. The device includes a unit for writing identical data in each memory cell of the plurality of memory blocks, a unit for simultaneously reading data of one bit from each of the plurality of memory blocks, a unit for detecting coincidence or non-coincidence of the read bits and outputting a result of the detection, and a unit for sequentially outputting the read bits one by one when the result is the non-coincidence. As a result, an address of a "failing" bit can be detected to facilitate a failure analysis, thereby reducing test time.

15 Claims, 10 Drawing Sheets

SEMICONDUCTOR MEMORY DEVICE WITH BUILT-IN TEST CIRCUIT AND METHOD FOR TESTING THE SAME

BACKGROUND OF THE INVENTION

1. Field of the Invention

The present invention relates to a technique of testing a semiconductor memory device. More particularly, it relates to a semiconductor memory device having a memory cell array divided into a plurality of blocks to and from which data of a plurality of bits (2N bits) based on N-bit address degeneration are input and output in a test mode, and a method for testing the semiconductor memory device.

2. Description of the Related Art

With recent improvements in the capacity of semiconductor memory devices, their increasing test time is causing a problem. To cope with this, a test mode function for compressing data of 2N bits based on N-bit address degeneration and simultaneously outputting the compressed data is gradually provided for the semiconductor memory devices.

According to a known test mode function, a test mode is firstly set, and identical data is simultaneously written in each cell for 2N bits. Thereafter, the data of 2N bits are compressed and simultaneously read, thereby realizing a high-speed data reading to shorten test time. This test mode function may be effective to check whether or not many bits (for example, all bits of each word) coincide with one another.

The above test mode function has, however, a drawback that, when information of a certain bit among the read 2N bits does not coincide with information of the other bits (this status is hereinafter referred to as "fail"), it cannot identify the "fail" bit in the 2N bits. Accordingly, the test function based on compressed data alone is insufficient for failure analysis. In addition, this technique requires the test to be done 2N times, thereby consuming enormous test time.

On the other hand, in semiconductor memory devices having a redundant function, their capacities as well as their bit capacities of redundant cells are increasing. It is, therefore, required to provide a technique for efficiently using the redundant cells as well as a technique for efficiently carrying out a test with a test mode function such as the one explained above.

In this case, if data to be replaced by the redundant function are 2M bits among 2N bits, the test function based on 2N-bit-compressed data cannot tell which of 2L sets of 2M bits (2N=2M·2L) shall be replaced. This is disadvantageous for a manufacturer in efficiently using the redundant cells.

SUMMARY OF THE INVENTION

An object of the present invention is to provide a semiconductor memory device that can detect the address of a "fail" bit to facilitate failure analysis and shorten test time, and a method for testing the semiconductor memory device.

Another object of the present invention is to provide a semiconductor memory device having a redundant structure, which can identify the address of a redundant bit to effectively use redundant cells, and a method for testing the semiconductor memory device.

According to one aspect of the present invention, there is provided a semiconductor memory device having normal and test modes, including: a memory cell array divided into a plurality of memory blocks each having memory cells arranged in rows and columns; a write/read control circuit operatively connected to the memory cell array and responsive to external address signals and control signals, for writing identical data in each memory cell of the memory cell array and simultaneously read data of one bit from the respective memory block in the test mode; a gate circuit operatively connected to the memory cell array and passing, under given conditions, data of a plurality of bits read from the plurality of memory blocks in the test mode; and a test circuit operatively connected to the memory cell array, write/read control circuit and gate circuit, for detecting coincidence or non-coincidence of the bits of the read data, outputting a result of the detection and, when the result is the non-coincidence, controlling the gate circuit to sequentially output the plurality of bits one by one.

Also, according to another aspect of the present invention, there is provided a method for testing a semiconductor memory device including a plurality of memory blocks each having memory cells arranged in rows and columns, including the steps of: writing identical data in each memory cell of the plurality of memory blocks; simultaneously reading data of one bit from the respective memory block; detecting coincidence or non-coincidence of the respective bit of the read data, outputting a result of the detection and, when the result is the non-coincipence, sequentially outputting the data of the plurality of bits bit by bit, thereby detecting an address of a failing bit.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

For a better understanding of the preferred embodiments of the present invention, the problem in the prior art will be explained with reference to FIG. 1.

Figure 1:
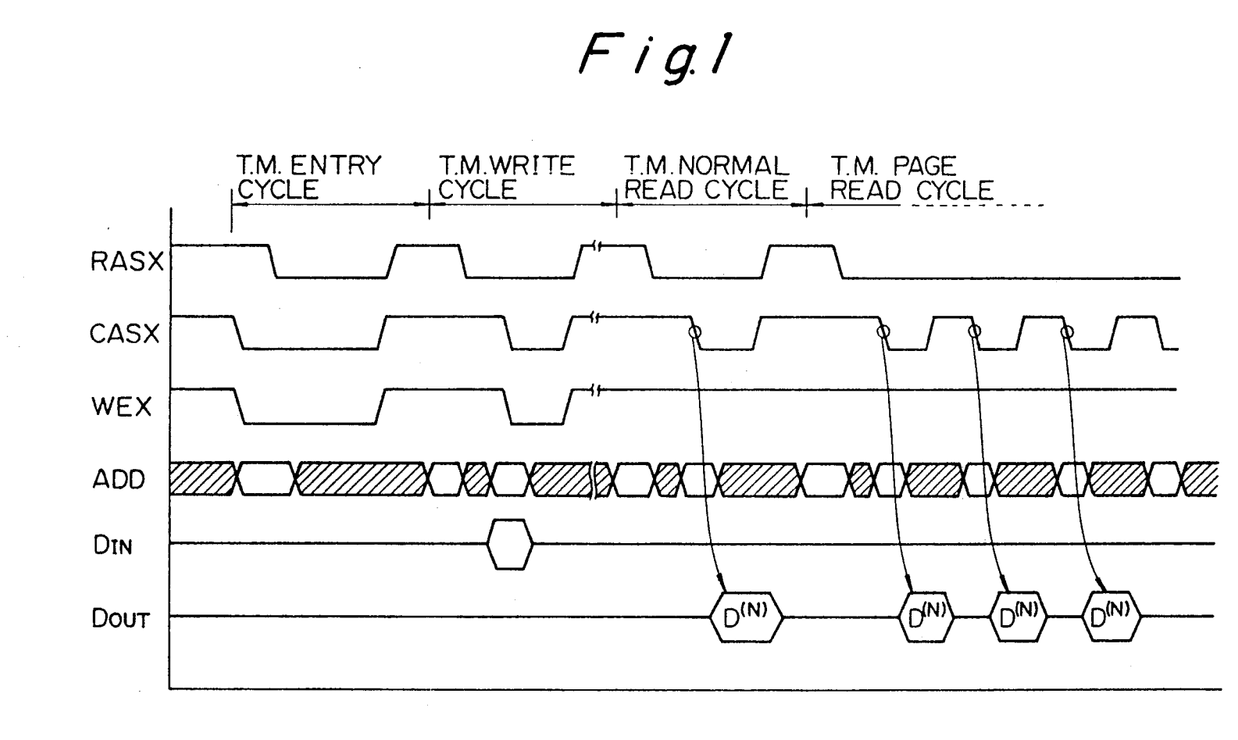
FIG. 1 is a timing chart showing an example of typical operation in a test mode.

FIG. 1 shows an example of typical operation timing in a test mode.

Figure 5:
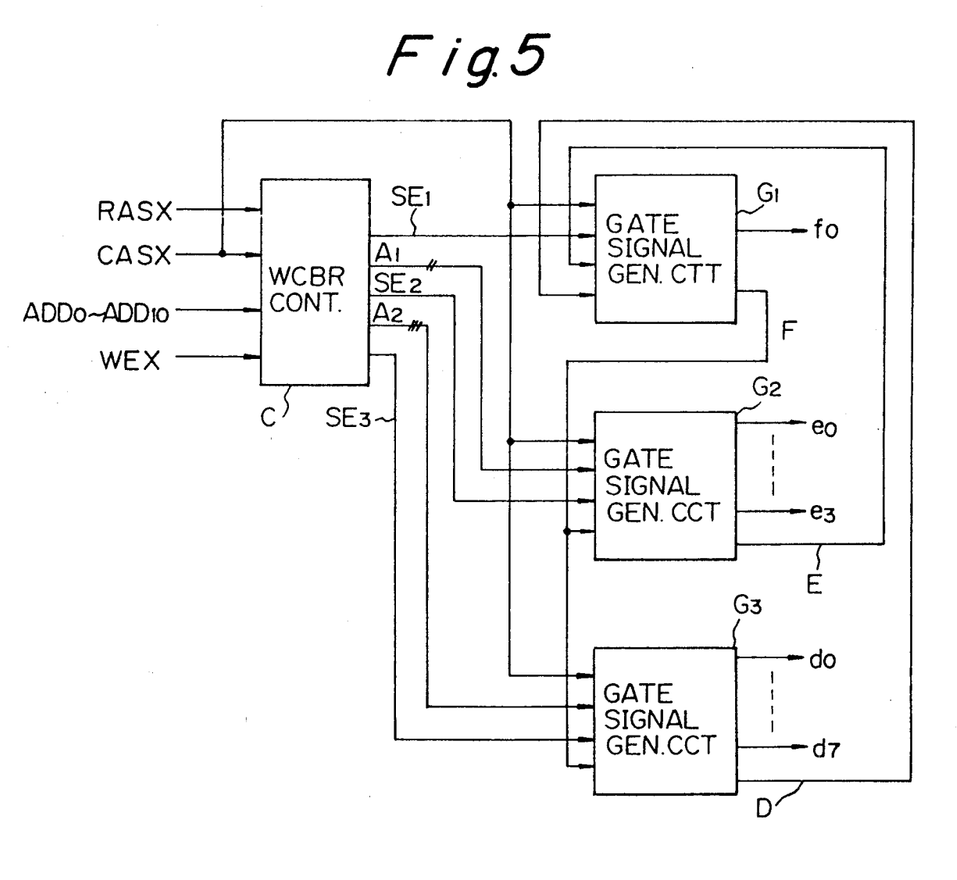
FIG. 5 is a block diagram showing an exemplary arrangement of a circuit for generating gate signals for respective transistors of FIGS. 4A and 4B.

First, in a test mode entry cycle, a technique of input terminal super voltage entry, WCBR (Write enable Column address strobe Before Row address strobe) entry, or WCBR address logic entry shown in FIG. 5 is used to enter the test mode. Next, in a test mode write cycle, data is simultaneously written in cells for 2N bits. In a test mode normal read cycle, data of 2N bits are compressed based on N-bit address degeneration and simultaneously read. For compressing the data, the following techniques are known:

A. "0" and "1" Output Form

This technique provides "1" when all bits of the data of 2N bits coincide with one another, and provides "0" when even one of the bits does not coincide with the others, i.e., when there is a fail bit.

B. "0", "1" and "Z" Output Form

This technique provides "0" when all bits of the data of 2N bits are each "0"; "1" when all the bits are each "1"; and a high-impedance state "Z", i.e., a floating state when there is at least one "fail" bit. A technique employing this "0", "1" and "Z" output form is disclosed in, for example, U.S. Pat. No. 4,464,750 to Tatematsu.

Further, in a test mode page read cycle of FIG. 1, all data of cells selected by a word selecting line are simultaneously read as 2N-bit-compressed data. This realizes speedier data read to reduce test time.

The compressed data test mode may check all bits of each word in short time but cannot find, when a "fail" bit exists, which of the 2N bits is the fail bit. The compressed data test mode alone is, therefore, insufficient and not preferable for failure analysis. In the 2N-bit-compressed data test mode, the test must be repeated 2N times to consume enormous test time.

Further, in a semiconductor memory device having a redundant structure in which a redundant function simultaneously replaces, for example, 2M bits among 2N bits, the 2N-bit-compressed data test mode cannot tell which of 2L sets of 2M bits (2N=2M·2L) must be replaced. As a result, the redundant cells cannot efficiently be used.

Next, preferred embodiments of the present invention will be explained with reference to FIGS. 2 to 9.

Figure 2:
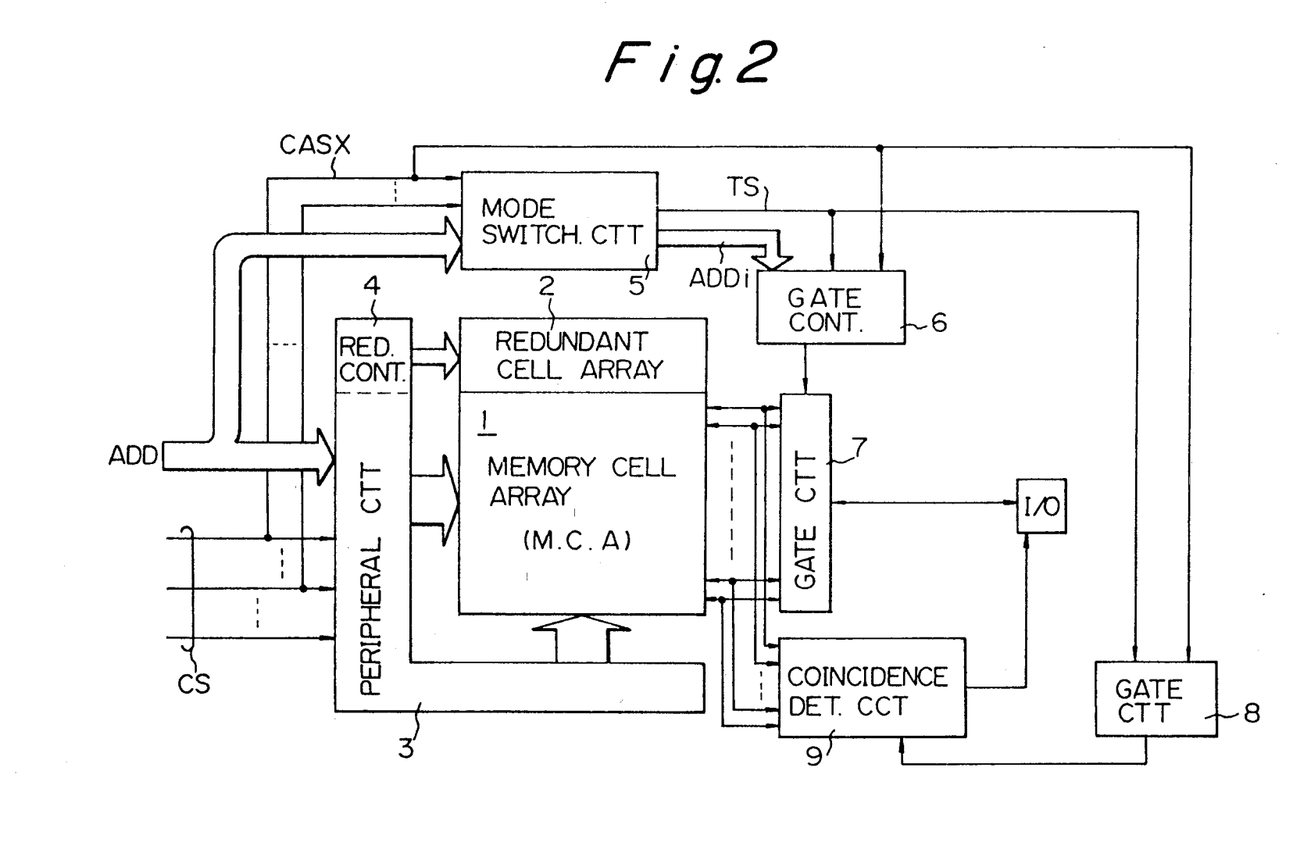
FIG. 2 is a block diagram schematically showing the basic arrangement of a semiconductor memory device according to the present invention.

FIG. 2 schematically illustrates the basic arrangement of a semiconductor memory device according to the present invention. The arrangement of the figure is only a part that relates to a test mode.

In the figure, reference 1 is a memory cell array (M.C.A.) divided into 2N blocks each having memory cells arranged in rows and columns; reference 2 is a redundant cell array for saving, for example, 2M bits (2N>2M) of part of the blocks of the memory cell array; and reference 3 is a peripheral circuit. The peripheral circuit 3 includes a redundant control portion 4 for controlling the replacement of regular cells of the memory cell array 1 with redundant cells of the redundant cell array 2; a decoder for decoding an address signal ADD to select the memory cells; a control portion for controlling write and read operations in response to various control signals CS.

Reference 5 is a mode switching circuit for switching a normal mode under which normal data read and write operations are carried out according to external address signals ADD and part of control signals and a test mode from one to the other. In the test mode, a test signal TS is provided. The test mode involves two phases. One phase is to test whether or not the respective bits of data of 2N bits simultaneously read out of the memory cell array 1 coincide with one another. The other phase is to test, when the bits do not coincide with one another, which of the 2N bits is a failed bit by outputting the bits one by one. As the normal mode, there is a so-called "nibble mode" in which a column address strobe signal CASX is toggled, and data is input and output bit by bit in response to falling edges of the signal.

Reference 6 is a gate control circuit responding to the test signal TS from the mode switching circuit 5, a part ADDi of address information and the column address strobe signal CASX; reference 7 is a gate circuit for providing, bit by bit, data of 2N bits simultaneously read out of the memory cell array 1 in the test mode to an input/output terminal I/O under the control of the gate control circuit 6; reference 8 is a gate circuit responding to the test signal TS from the mode switching circuit 5 as well as external column address strobe signal CASX; and reference 9 is a coincidence detecting circuit for detecting, under the control of the gate circuit 8, whether or not the respective bits of the data of 2N bits simultaneously read out of the memory cell array 1 in the test mode coincide with one another, and outputting a result of the detection to the input/output terminal I/O. In this case, the gate circuit 8 activates the coincidence detecting circuit 9 when the test signal TS alone is provided, and inactivates the coincidence detecting circuit 9 when the test signal as well as the column address strobe signal CASX are provided.

Figure 3:
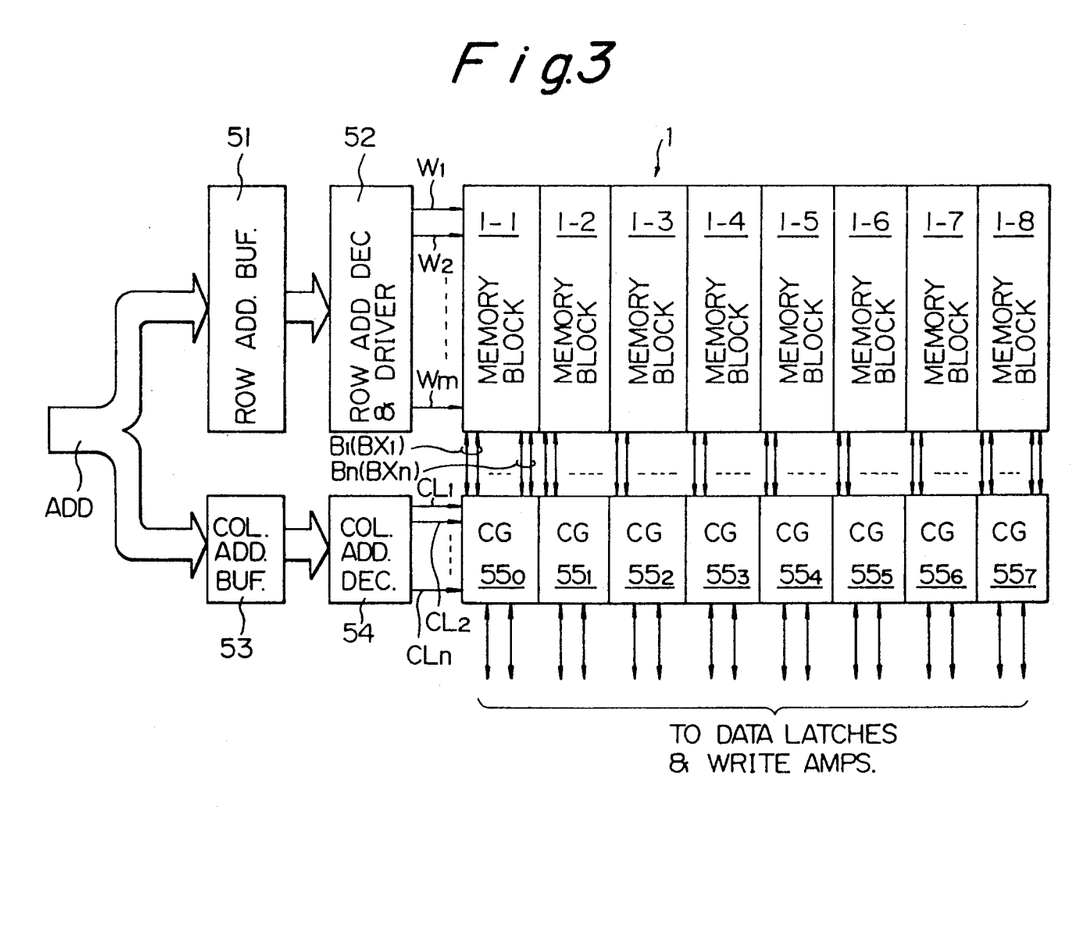
FIG. 3 is a block diagram showing a memory cell array of FIG. 2 and a peripheral arrangement thereof.

FIG. 3 is a view showing the memory cell array of FIG. 2 and the periphery thereof. In the figure, the redundant portion is omitted.

As shown in the figure, the memory cell array 1 is divided into eight memory blocks 1-1 to 1-8, which are connected to column gates 550 to 557, respectively, through n pairs of complementary bit lines B1, BX1, . . . , Bn, BXn. Reference 51 is a row address buffer for buffering a row address signal among externally given address signals ADD and generating complementary row address signals; reference 52 is a row address decoder and driver for decoding the row address signals, selecting one of m word lines W1 to Wm and driving the selected word line; reference 53 is a column address buffer for buffering a column address signal among the external address signals ADD and generating complementary column address signals; and reference 54 is a column address decoder for decoding the column address signals and selecting one of n column lines CL1 to CLn. The respective column gates 550 to 557 select complementary bit lines corresponding to the selected column line and connect the selected ones to circuits (see FIGS. 4A and 4B) of the next stage.

Figures 4, 4A:
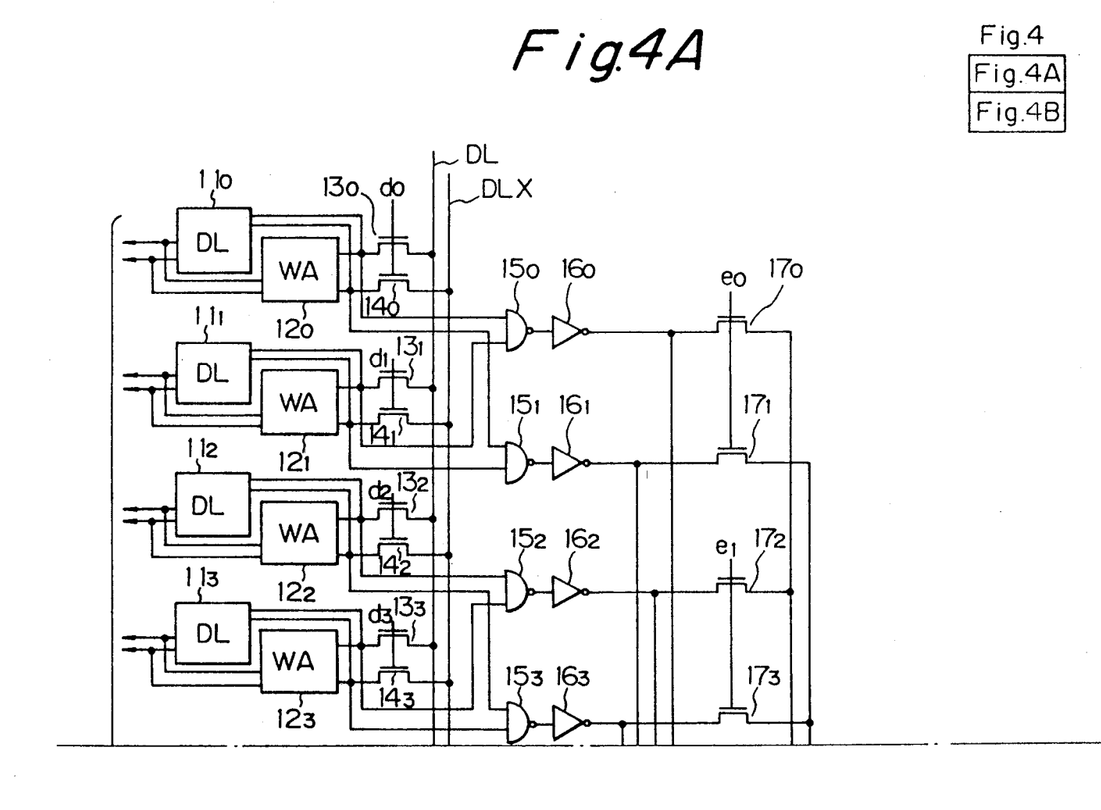
FIGS. 4A and 4B are circuit diagrams showing the details of a data input and output portion of FIG. 2.
Figure 4B:
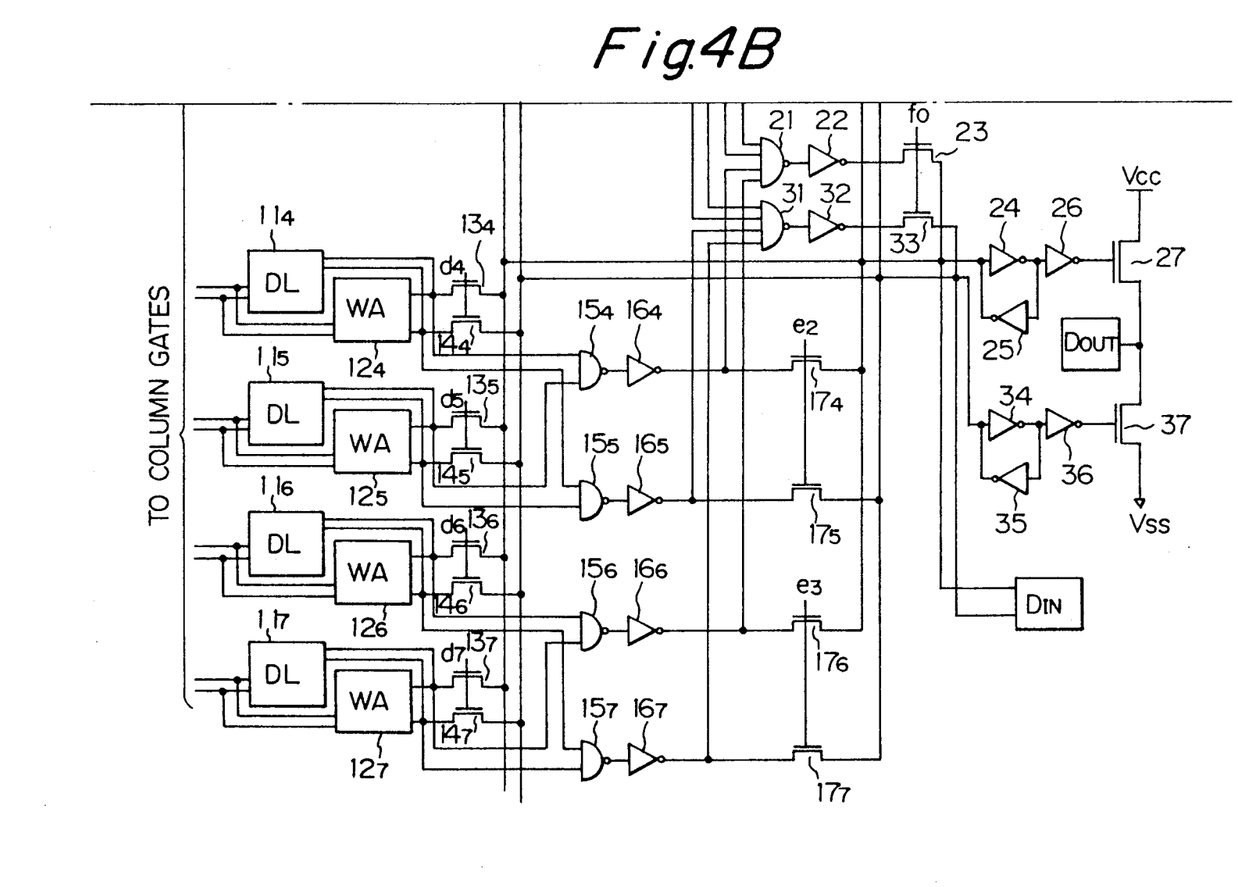

FIGS. 4A and 4B show the details of the data input/output portion of FIG. 2.

In the figure, references 110 to 117 are data latches for amplifying data read through the column gates 550 to 557 and temporarily latching the amplified data; and references 120 to 127 are write amplifiers for amplifying externally given write data. The data latch 110 (111) and write amplifier 120 (121) are connected to a pair of complementary data lines DL and DLX through a pair of n-channel transistors 130 and 140 (131 and 141), to one (the other) input end of a NAND gate 150 and to one (the other) input end of a NAND gate 151. Further, the data latch 112 (113) and write amplifier 122 (123) are connected to the complementary data lines DL and DLX through a pair of n-channel transistors 132 and 142 (133 and 143), to one (the other) input end of a NAND gate 152 and to one (the other) input end of a NAND gate 153.

Similarly, the data latch 114 (115) and write amplifier 124 (125) are connected to the complementary data lines DL and DLX through a pair of n-channel transistors 134 and 144 (135 and 145), to one (the other) input end of a NAND gate 154 and to one (the other) input end of a NAND gate 155. Further, the data latch 116 (117) and write amplifier 126 (127) are connected to the complementary data lines DL and DLX through a pair of n-channel transistors 136 and 146 (137 and 147), to one (the other) input end of a NAND gate 156 and to one (the other) input end of a NAND gate 157.

Output ends of the NAND gates 150 to 157 are connected to sources (drains) of n-channel transistors 170 to 177 through inverters 160 to 167, respectively. Output ends of the inverters 160, 162, 164 and 166 are connected to input ends of a NAND gate 21, and output ends of the inverters 161, 163, 165 and 167 are connected to input ends of a NAND gate 31. Output ends of the NAND gates 21 and 31 are connected to sources (drains) of n-channel transistors 23 and 33 through inverters 22 and 32, respectively. The drains (sources) of the transistors 170, 172, 174, 176 and 23 are connected to an input end of an inverter 24, to an output end of an inverter 25 and to an input terminal DIN. The drains (sources) of the transistors 171, 173, 175, 177 and 33 are connected to an input end of an inverter 34, to an output end of an inverter 35 and to the input terminal DIN.

An output end of the inverter 24 is connected to an input end of the inverter 25 as well as to a gate of an n-channel transistor 27 through an inverter 26. An output end of the inverter 34 is connected to an input end of the inverter 35 as well as to a gate of an n-channel transistor 37 through an inverter 36. A drain (source) of the transistor 27 is connected to a high-potential power source line Vcc, and the source (drain) thereof is connected to an output terminal DOUT. A drain (source) of the transistor 37 is connected to the output terminal DOUT, and the source (drain) thereof is connected to a low-potential power source line Vss.

Gates of the transistor pairs 130 and 140 to 137 and 147 are applied with gate signals d0 to d7, respectively. Gates of the transistor pairs 170 and 171 to 176 and 177 are applied with gate signals e0 to e3, respectively. Gates of the transistors 23 and 33 are applied with a gate signal f0.

FIG. 5 shows an example of a circuit for generating the gate signals.

In the figure, reference C is a WCBR address logic control circuit responds to an active-low write enable signal WEX, a row address strobe signal RASX, a column address strobe signal CASX and address signals ADD0 to ADD10 of 11 bits, and outputs enable signals SE1, SE2 and SE3, a two-bit address signal A1 (ADD8 and ADD9), and three-bit address signal A2 (ADD8 to ADD10). Reference G1 is a gate signal generating circuit basically activated by the enable signal SE1 of a predetermined level and generates the gate signal f0 in response to a falling edge of the column address strobe signal CASX. The gate signal generating circuit G1 can generate the gate signal f0 in response to a control signal E or D to be described later. After the generation of the gate signal f0, the circuit G1 provides a control signal F.

Reference G2 is a gate signal generating circuit activated by the enable signal SE2 of a predetermined level to decode the address signal A1 and sequentially generate the gate signals e0 to e3 in response to the control signal F and column address strobe signal CASX.

After the generation of the last gate signal e3, the circuit G2 provides the control signal E. Similarly, reference G3 is a gate signal generating circuit activated by the enable signal SE3 of a predetermined level to decode the address signal A2 and sequentially generate the gate signals d0 to d7 in response to the control signal F and column address strobe signal CASX.

After the generation of the last gate signal d7, the circuit G3 provides the control signal D. The respective gate signal generating circuits G1 to G3 are not simultaneously activated.

Figure 6:
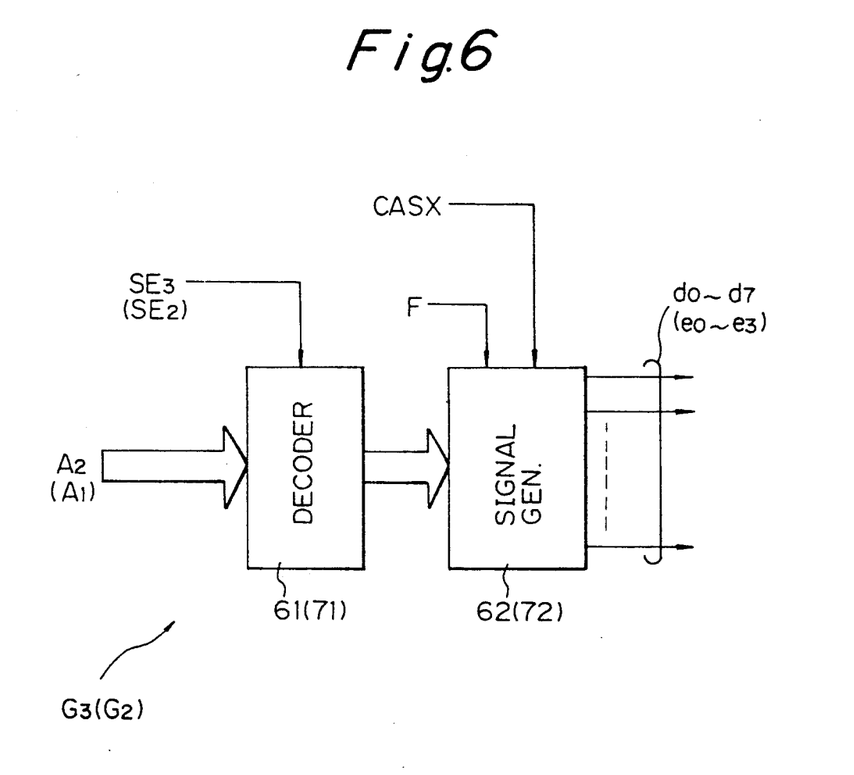
FIG. 6 is a block diagram showing an arrangement of the gate signal generating circuit of FIG. 5.

The gate signal generating circuit G3 (G2) comprises, as exemplarily shown in FIG. 6, a decoder 61 (71) activated by the enable signal SE3 (SE2) to decode the three-bit address signal A2 (two-bit address signal A1) and a signal generator 62 (72) for sequentially generating, according to the decoded information, the gate signals d0 to d7 (e0 to e3) in response to falling edges of the control signal F and column address strobe signal CASX.

In this case, there are two ways of sequentially generating the gate signals d0 to d7 (e0 to e3). One way is to apply the address signal A2 (A1) to sequentially change respective address bits. The other way is to fix address information and toggle the column address strobe signal CASX between "H" and "L" levels alternately.

The control circuit C and gate signal generating circuit G3 of FIG. 5 correspond to the mode switching circuit 5 and gate control circuit 6 of FIG. 2, respectively. The transistors 130, 140, ..., 137, 147 of FIGS. 4A and 4B correspond to the gate circuit 7 of FIG. 2. The logic gates 150 to 157, 160 to 167, 21, 22, 24 to 26, 31, 32 and 34 to 36 of FIGS. 4A and 4B correspond to the coincidence detecting circuit 9 of FIG. 2. Further, the gate signal generating circuits G1 and G2 of FIG. 5 and the transistors 170 to 177, 23 and 33 of FIGS. 4A and 4B correspond to the gate circuit 8 of FIG. 2.

In the arrangement of FIGS. 4A and 4B, the respective gate signals are properly applied to the corresponding transistors to provide the following three statuses of data output:

(1) With the gate signal f0, 23-bit-compressed data (hereinafter represented with D(3)) based on three-bit address degeneration is provided. In this case, the transistors 23 and 33 are turned ON with the gate signal f0 of "H" level, thereby providing the 23-bit-compressed data D(3).

(2) With the gate signals e0 to e3, 21-bit-compressed data (hereinafter represented with D0(1) to D3(1)) are continuously provided 22 times according to the "0", "1" and "Z" form. In this case the gate signals e0 to e3 are sequentially set to an "H" level according to the address signals ADD8 and ADD9 of two bits to sequentially turn ON the corresponding transistor pairs 170 and 171 to 176 and 177, thereby sequentially outputting 21-bit-compressed data D0(1), D1(1), D2(1), and D3(1).

(3) With the gate signals d0 to d7, data of 23 bits (hereinafter represented with D0 to D7) are provided bit by bit according to the "0", "1" and "Z" form with no data compression. In this case, the gate signals d0 to d7 are sequentially set to an "H" level according to the address signals ADD8 to ADD10 of three bits to sequentially turn ON the corresponding transistor pairs 130 and 140 to 137 and 147, thereby sequentially outputting the one-bit data D0 to D7.

Next, the test operation by the device of FIG. 2 will be explained with reference to the flowchart of FIG. 7.

First, at step S1, the mode switching circuit 5 sets the test mode. In the next step S2, the peripheral circuit 3 writes identical data in each cell of the memory cell array (M.C.A.) 1. At step S3, the peripheral circuit 3 sets a first block address from which data are read. Here, the block address forms a part of an address of a plurality of bits for reading data, word by word, from the memory cell array 1, and is combined with an N-bit degeneration address to form the address of the plurality of bits.

At step S4, the peripheral circuit 3 simultaneously read data of 2N bits (eight bits in the example of FIG. 3) based on the N-bit degeneration address for the set block address. In the next step S5, the coincidence detecting circuit 9 detects whether or not the bits of the read data coincide with one another and provides a result of the detection to the input/output terminal I/O. If the result is "coincidence", the flow proceeds to step S6 where the peripheral circuit 3 changes the block address (sets the next block address), and the flow returns to step S4.

If the result is "non-coincidence" at step S5, the flow proceeds to step S7. At step S7, the gate control circuit 6 and gate circuit 7 function to sequentially output the data of 2N bits (eight bits in this example) bit by bit to the input/output terminal I/O. As a result, the address of a "fail" bit can be detected (step S8). In the next step S9, the peripheral circuit 3 determines whether the present block address is the last one (YES) or not (NO). If a result of the determination is "YES", the flow goes to "END", and if the result is "NO", the flow proceeds to step S6 to repeat the above-mentioned processes.

In this way, according to the test method of the present invention, data of a plurality of bits (2N bits) are simultaneously read from a memory cell array in a test mode. The coincidence or the non-coincidence of the respective bits of the data with one another is determined and output. If the result is the non-coincidence, the respective bits of the data are output bit by bit and determined whether each bit is a "pass" bit or a "fail" bit.

Accordingly, if there is a "fail" bit in the 2N-bit-compressed data test mode, it is possible to surely detect which of the 2N bits is the "fail" bit, and the failure analysis can be completed in short time compared to normal mode reading.

In addition, when 2M bits among data of 2N bits are simultaneously replaced by a redundant function, it is possible to tell which of 2L sets of 2M bits (2N=2M·2L) must be replaced. This is remarkably effective for efficiently using redundant cells.

Figure 8:
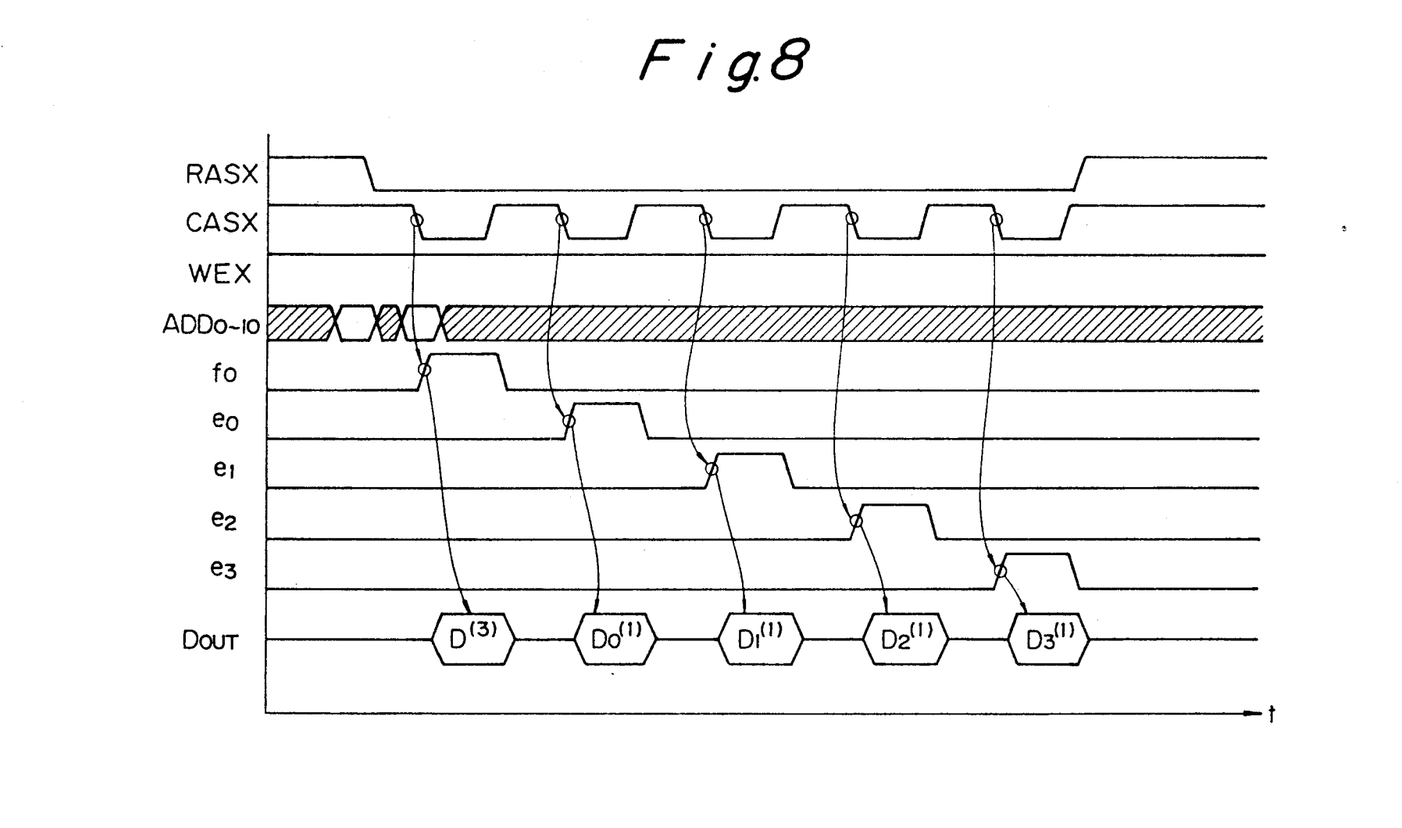
FIG. 8 is a timing chart showing an example of test mode operation of the device of FIG. 2.
Figure 9:
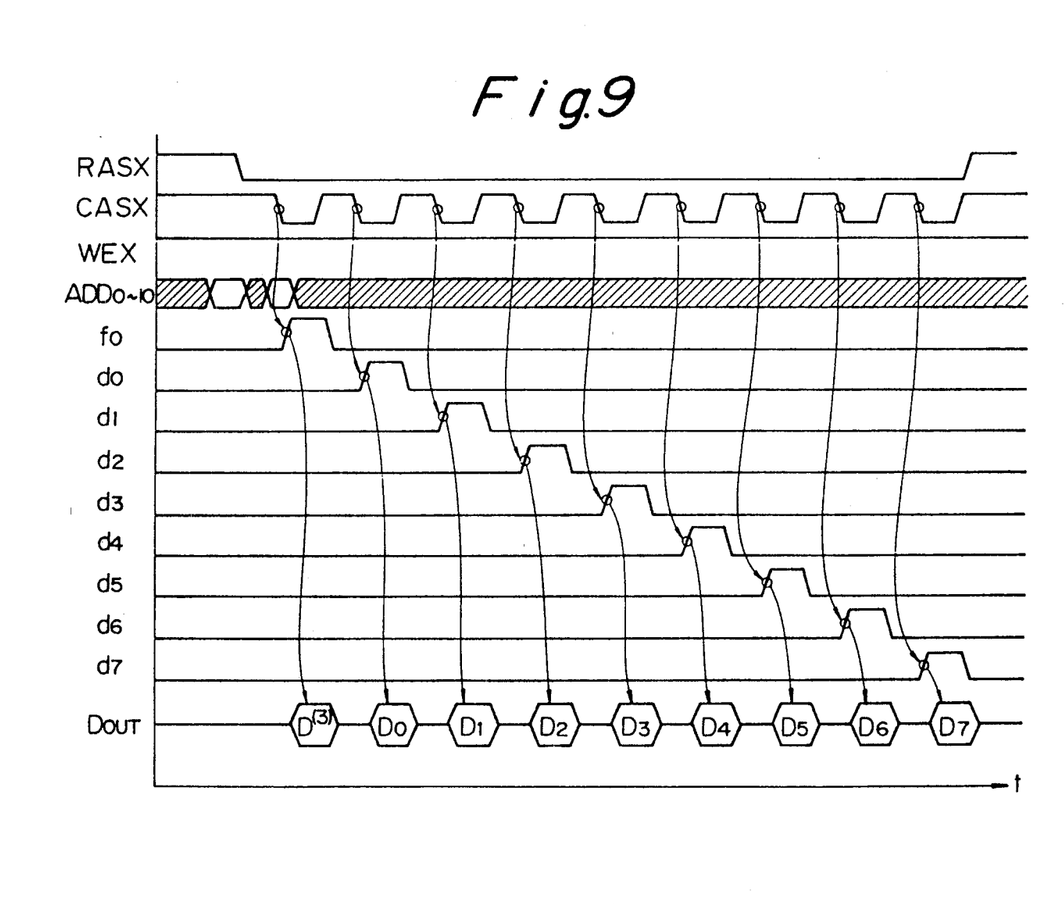
FIG. 9 is a timing chart showing another example of test mode operation of the device of FIG. 2.

FIGS. 8 and 9 show examples of operation timing of the device of FIG. 2 in the test mode.

In the example of FIG. 8, the output statuses (1) and (2) explained above are employed together. Namely, address signals ADD0 to ADD10 of 11 bits are latched at a falling edge of the row address strobe signal RASX. Thereafter, at a falling edge of the column address strobe signal CASX, 23-bit-compressed data D(3) is selected and output according to the latched address signals ADD0 to ADD7 of eight bits. At the same time, according to the address signals ADD8 and ADD9 of two bits, 21-bit-compressed data D0(1) is selected and output. Thereafter, 21-bit-compressed data D1(1) to D3(1) are successively output at falling edges of the column address strobe signal CASX.

On the other hand, the example of FIG. 9 employs the output statuses (1) and (3) explained above together. Namely, address signals ADD0 to ADD10 of 11 bits are latched at a falling edge of the row address strobe signal RASX. Thereafter, at a falling edge of the column address strobe signal CASX, 23-bit-compressed data D(3) is selected and output according to the latched address signals ADD0 to ADD7 of eight bits. At the same time, according to the address signals ADD8 to ADD10 of three bits, one-bit data D0 is selected and output. Thereafter, one-bit data D1 to D7 are successively output at falling edges of the column address strobe signal CASX.

In this case, operation timing of the respective signals is indicated on an assumption that the respective bits of the selected 23-bit-compressed data D(3) are not coinciding with one another. If the bits of the 23-bit-compressed data D(3) are coinciding with one another, the next 23-bit-compressed data is selected and output (corresponding to steps S5 (YES), S6 and S4 of FIG. 7). The selecting and outputting operations are repeated until failed 23-bit-compressed data is output.

Figure 7:
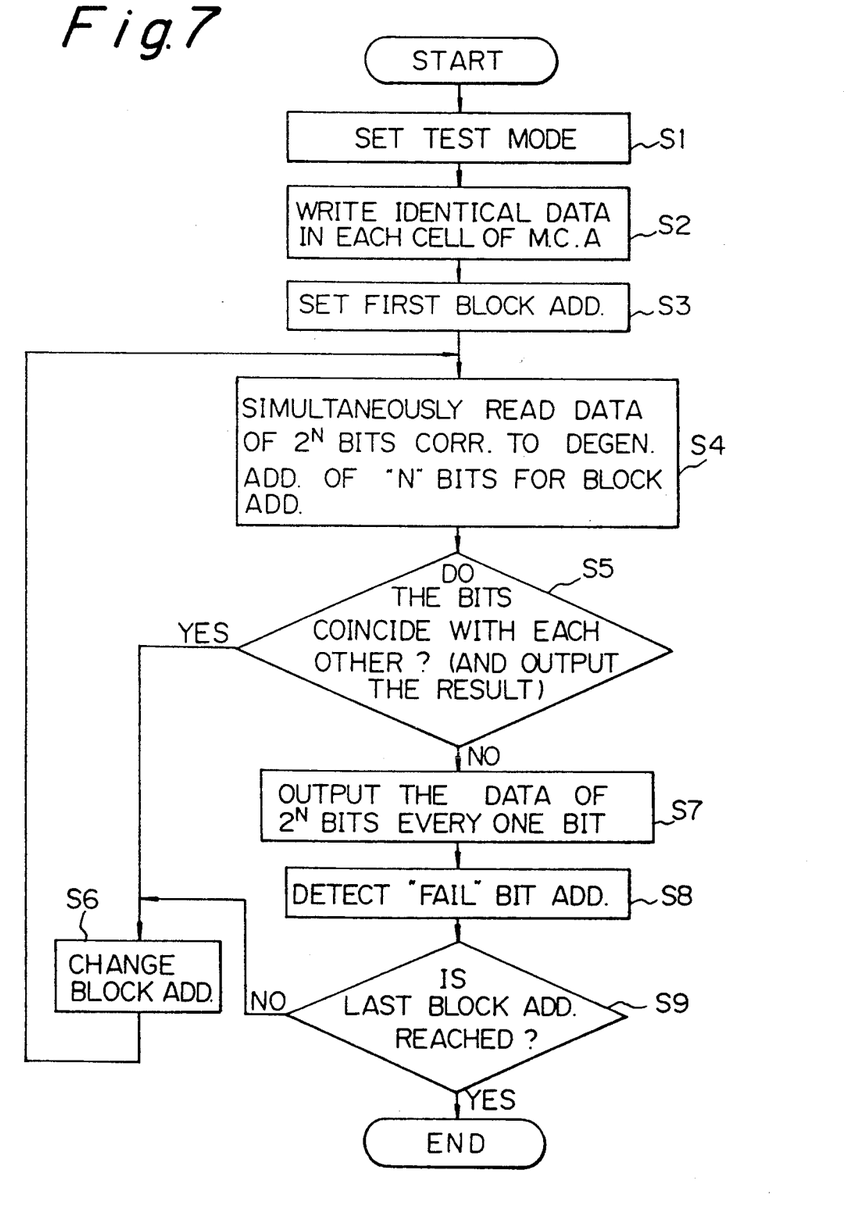
FIG. 7 is a flowchart showing a testing operation of the device of FIG. 2.

Thereafter, one-bit data D0 to D7 are sequentially output (corresponding to steps S7 and S8 of FIG. 7).

Although the present invention has been disclosed and described by way of one embodiment, it is apparent to those skilled in the art that other embodiments and modifications of the present invention are possible without departing from the spirit or essential features thereof.

I claim:

1. A semiconductor memory device having normal and test modes, comprising:
    a memory cell array divided into a plurality of memory blocks each having memory cells arranged in rows and columns;
    write/read control circuit operatively connected to said memory cell array and responsive to external address signals and control signals, for writing identical data in each of said memory cells of said memory cell array and, in said test mode, for simultaneously reading data of one bit from each of said plurality of memory blocks;
    a gate circuit operatively connected to said memory cell array, for passing, under given conditions, data of a plurality of bits read from said plurality of memory blocks in said test mode;
    a test circuit operatively connected to said memory cell array, write/read control circuit and gate circuit, a) for detecting coincidence or non-coincidence of a plurality of said simultaneously read bits, b) for outputting a result of the detection and c) when the result is the non-coincidence, for controlling said gate circuit to sequentially output said plurality of bits bit by bit; and
    terminal means for outputting the plurality of sequentially output bits.

2. A device as set forth in claim 1, comprising a plurality of pairs of data buses corresponding to the number of said plurality of memory blocks, wherein said write/read control circuit includes a decoding circuit for selecting one memory cell in each of said plurality of memory blocks according to said address signal, and a plurality of column gates for transmitting data of said selected memory cells to said data buses correspondingly.

3. A device as set forth in claim 2, comprising a pair of common data lines connected to an external terminal, wherein said gate circuit has a plurality of pairs of transistors connected between respective pairs of said data buses and said pair of data lines, said pairs of transistors being turned ON under control of said test circuit.

4. A device as set forth in claim 3, wherein said test circuit comprises a first signal-generating circuit for sequentially generating gate signals for turning ON said pairs of transistors, respectively.

5. A device as set forth in claim 4, wherein said test circuit comprises a plurality of logic gates for respectively detecting, in said test mode, whether or not data of two bits output to two pairs of said plurality of pairs of data buses coincide with each other, a plurality of pairs of transistors for transmitting results of the detection, respectively, to said pair of data lines, and a second signal-generating circuit for sequentially generating gate signals for turning ON said plurality of pairs of transistors, respectively.

6. A device as set forth in claim 5, wherein said test circuit comprises a circuit for detecting, in said test mode, whether or not data of a plurality of bits output to said plurality of pairs of data buses coincide with one another, a pair of transistors for transmitting a result of the detection to said pair of data lines, and a third signal-generating circuit for generating a gate signal for turning ON said pair of transistors.

7. A device as set forth in claim 6, further comprising a control circuit for switching said test mode and normal mode from one to the other according to address signals and control signals, said first, second and third signal-generating circuits being separately activated by outputs of said control circuit.

8. A device as set forth in claim 7, wherein each of said first and second signal-generating circuits comprises a decoder for decoding address information in response to an activating signal from said control circuit, and a circuit for generating said gate signals in response to the decoded information and an external column address to strobe signal.

9. A semiconductor memory device having normal and test modes, comprising:
   a memory cell array divided into 2N memory blocks each having memory cells arranged in a matrix;
   a redundant means for simultaneously replacing data of 2M bits among 2N bits in said 2N memory blocks, where 2N¢2M;
   a write/read control circuit operatively connected to said memory cell array and responsive to external address signals and control signals, for writing identical data in each of said memory cells of said memory cell array and, in the test mode, for simultaneously reading data of one bit from each of said 2N memory blocks;
   a gate circuit operatively connected to said memory cell array, for passing, under given conditions, data of 2N bits read from said 2N memory blocks in said test mode;
   a test circuit operatively connected to said memory cell array, write/read control circuit and gate circuit, a) for detecting coincidence or non-coincidence of the 2N bits of said data, b) for outputting a result of the detection and, c) when the result is the non-coincidence, for controlling said gate circuit to sequentially output said data of 2N bits bit by bit; and
   terminal means for outputting the plurality of sequentially output bits.

10. A device as set forth in claim 9, wherein said test circuit comprises a means for compressing said data of 2M bits to form 2M-bit-compressed data and successively outputting 2M-bit-compressed data 2L times in response to given control signals, where $2N = 2M \cdot 2L$.

11. A semiconductor memory device having normal and test modes, comprising:
   a memory cell array divided into a plurality of memory blocks each having memory cells arranged in rows and columns;
   a write/read control circuit operatively connected to said memory cell array and responsive to external address signals and control signals, for writing identical data in each of said memory cells of said memory cell array and, in said test mode, for simultaneously reading data of one bit from each of said plurality of memory blocks;
   a gate circuit operatively connected to said memory cell array, for passing, under given conditions, data of a plurality of bits read from said plurality of memory blocks in said test mode;
   a single terminal means for outputting the plurality of bits; and
   a test circuit operatively connected to said memory cell array, write/read control circuit and gate circuit, a) for detecting coincidence or non-coincidence of a plurality of said simultaneously read bits, b) for outputting a result of the detection to said single terminal means, and c) for controlling said gate circuit to sequentially output said plurality of bits bit by bit to said single terminal means during the test mode when the result of the detection is non-coincidence.

12. A method for testing a semiconductor memory device including a plurality of memory blocks each having memory cells arranged in rows and columns, comprising the steps of:
   writing identical data in each of said memory cells of said plurality of memory blocks;
   simultaneously reading data of one bit from each of said plurality of memory blocks;
   detecting coincidence or non-coincidence of a plurality of said simultaneously read bits and outputting a result of the detection; and
   sequentially outputting said plurality of bits bit by bit when the result of the detection is the non-coincidence, therein detecting an address of a failing bit.

13. A method as set forth in claim 12, wherein said step of sequentially outputting said plurality of bits bit by bit is carried out by sequentially changing bits of an address information.

14. A method as set forth in claim 12, wherein said step of sequentially outputting said plurality of bits bit by bit is carried out by sequentially changing a logic level of a column address strobe signal.

15. A method for testing a semiconductor memory device including a plurality of memory blocks each having memory cells arranged in a matrix and a redundant means for simultaneously replacing data in part of said plurality of memory blocks, comprising the steps of:
   writing identical data in each of said memory cells of said plurality of memory blocks in which the redundant replacement has been carried out;
   simultaneously reading data of one bit from each of said plurality of memory blocks;
   detecting coincidence or non-coincidence of said simultaneously read bits and outputting a result of the detection; and
   sequentially outputting said read bits bit by bit when the result of the detection is the non-coincidence, therein detecting an address of a failing bit.

* * * * *